United States Patent [19]

Beisswenger

[11] 4,245,159  
[45] Jan. 13, 1981

[54] QUICK-ACTING ELECTRON-OPTICAL LENSES

[75] Inventor: Siegfried Beisswenger, Preetz, Fed. Rep. of Germany

[73] Assignee: Dr. Ing. Rudolf Hell GmbH, Kiel, Fed. Rep. of Germany

[21] Appl. No.: 962,656

[22] Filed: Nov. 21, 1978

[30] Foreign Application Priority Data

Nov. 25, 1977 [DE] Fed. Rep. of Germany ....... 2752598

[51] Int. Cl.³ .............................................. G21K 1/08
[52] U.S. Cl. ............................ 250/396 ML; 250/311; 250/396 R; 315/382
[58] Field of Search ........... 250/396 ML, 396 R, 311; 315/382

[56] References Cited

U.S. PATENT DOCUMENTS

| | | | |
|---|---|---|---|
| 2,220,303 | 11/1940 | Tingley | 315/382 |
| 2,664,521 | 12/1953 | Schlesinger | 315/382 |
| 2,973,433 | 2/1961 | Kramer | 250/311 |
| 3,100,260 | 8/1963 | Wilska | 250/396 ML |
| 3,852,597 | 12/1974 | Yanaka et al. | 250/396 |

*Primary Examiner*—Harold A. Dixon
*Attorney, Agent, or Firm*—Brisebois & Kruger

[57] ABSTRACT

An electron-optical lens arrangement for electron beam apparatus having a static and a dynamic focussing lens system, in which the dynamic focussing lens system is situated inside the static focussing lens system.

11 Claims, 5 Drawing Figures

QUICK-ACTING ELECTRON-OPTICAL LENSES

BACKGROUND OF THE INVENTION

This invention relates to quick-acting electron-optical lenses.

There are many items of electron-beam equipment which employ electron guns of small diameter for technical and scientific purposes, examples being cathode-ray tubes for television or other reproducing purposes, electron microscopes, and materials-processing equipment.

To enable the electron beam emitted by the cathode to be focussed, complicated electron-optical lenses and diaphragm systems are provided in some cases. There are applications in which the focus has to be re-adjusted after the electron beam has been deflected, e.g. in cathode ray tubes, and there are cases in materials processing in which, with the electron beam stationary or in course of deflection, the focus is deliberately altered to produce a desired processing effect.

To enable this alteration in focus to be performed, a further focussing lens, also known as a dynamic focussing lens, is often provided in addition to the main lens, also termed the static lens, the static main lens being responsible for the overall foscussing and the re-adjustment or control of the position of the focus being being performed dynamically via the auxiliary lens. The lenses in question are generally in the form of magnetic coils.

In known electron-beam apparatus which employs an auxiliary lens for the dynamic focussing of the beam, the said lens is normally positioned between the beam generating system and the main lens. In materials processing using electron beams it has been found that there are instances where the focus has to be adjusted by a specific amount in a very short space of time. This of course is also a problem which occurs in types of reproduction apparatus which employ an electron beam, in cases where a high picture repetition frequency is required and the electron beam must therefore be deflected quickly and thus re-focussed quickly. To achieve the fast change in magnetic field which is required to produce a given change in the position of the focus, the dynamic auxiliary coil generally requires very high levels of energising power. In materials processing there are instances where the focus of the electron beam has to be adjusted in a time so short that the energising power required for the focussing coil is 1 kw or more. Since there are problems is handling such power levels, that is to say in changing the magnetic induction within the coil at the speed required, it is an object of the present invention to provide an improved dynamic focussing coil for electron-beam apparatus which requires a substantially lower power level.

SUMMARY OF THE INVENTION

Accordingly, the invention consists in an electron-optical lens arrangement of the kind comprising a static focussing lens system and a dynamic focussing lens system, wherein said dynamic lens system is arranged inside said static lens system.

The dynamic lens system is preferably located in the central region of the static lens system and specifically in the middle thereof, and may be an annular coil or in the form of two or more multipolar lenses. A screen may be provided between the fields set up by the two lens systems.

BRIEF DESCRIPTION OF THE DRAWINGS

Other features and properties will become apparent from a perusal of the suceeding description read in conjunction with the accompanying drawings showing one embodiment thereof by way of example and in which.

DETAILED DESCRIPTION OF PREFERRED EMBODIMENT

Figure 1:
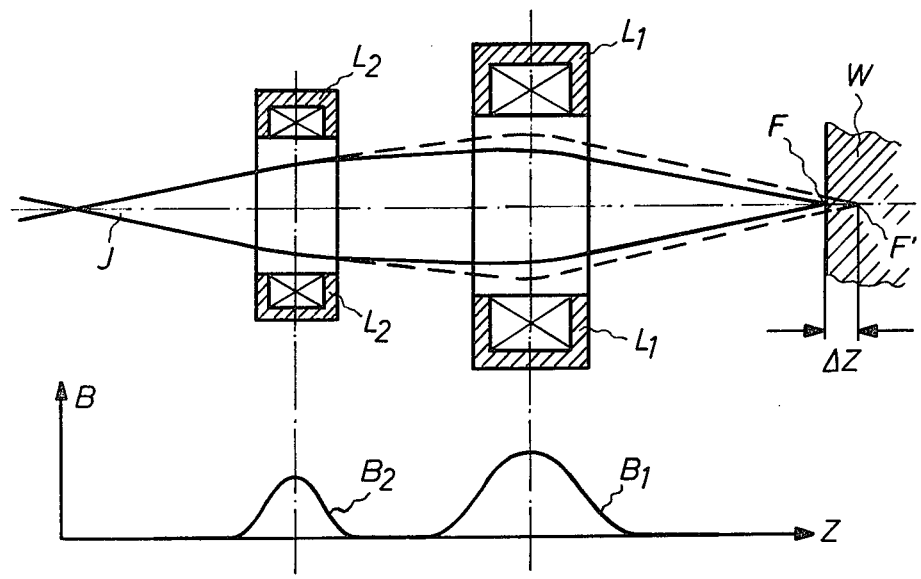
FIG. 1 shows the general lay-out of a known dynamic focussing arrangement.

Referring to the drawings, FIG. 1 is a schematic view simply of the section of the path of the electron beam of a known lens arrangement used for focussing. Before it impinges on a work-piece W, the electron beam J passes through an electro-magnetic lens arrangement $L_1$ which is known as a static focussing coil. The beam is focussed by this electron-optical collector lens onto a focus F. Underneath the static focussing lens $L_1$ is a diagram of the pattern of the magnetic field $B_1$ on the optical axis. To shift the focus to the position F' shown by the broken lines, a dynamic lens $L_2$ is usually arranged upstream of the static lens and by means of this dynamic lens the beam is spread or concentrated to a greater or lesser degree. Underneath the dynamic lens $L_2$ is shown the pattern of the magnetic field $B_2$ on the axis. The electron-optical power of refraction of the arrangement as a whole is dependent on the sum of the squares of the magnetic inductions $B^2 = B_1^2 + B_2^2$ (1) the overall displacement $\Delta Z$ being dependant only on the change in $B_2^2$.

Figure 2:
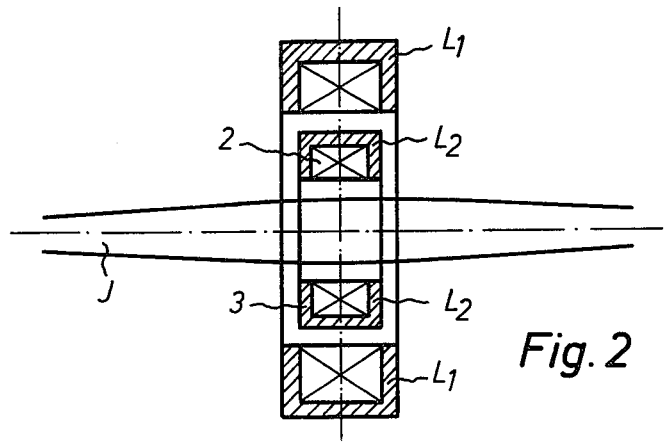
FIG. 2 shows an improved arrangement for the dynamic and static focussing coils, according to the invention.

FIG. 2 is a cross-section through an arrangement according to the invention for the static and dynamic focussing coils, the dynamic focussing coil being arranged inside the static focussing coil. In a manner familiar for magnetic concentrating coils, the dynamic focussing coil has a winding 2 concentric with the electron beam J, but it may be slightly off center. To screen and decouple the field of the dynamic focussing coil which alters with time, from the static lens surrounding it, use is made of a screening circuit 3 of high magnetic permeability which may preferably be made from high-frequency ferrite material in the case of very fast re-focussing operations.

The screen is preferably produced in the form of an annular body. In this case the coil 2 is connected to the screening body by a cast screening substance numeral 4. This provides an opportunity of preventing the insulated surface of the coil wires from becoming charged with stray electrons by making the casting substance electrically conductive. Favourable values for the specific resistance of the casting substance are between 1 K$\Omega$cm and 10 M$\Omega$cm.

Figures 3A, 3B, 3C:
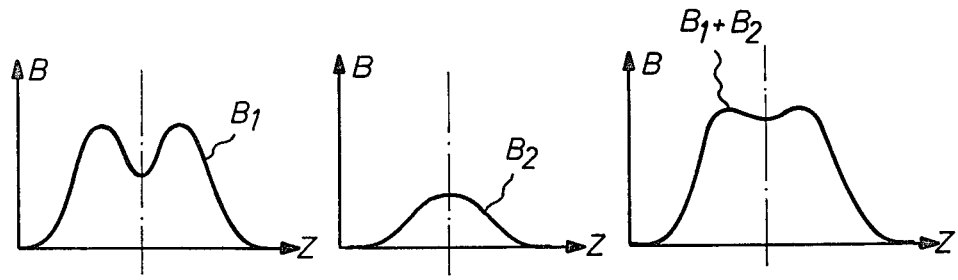
FIGS. 3a, 3b and 3c are illustrations of the magnetic induction on the axis of the coils.

FIG. 3a is a diagram of the magnetic induction on the axis when only the static lens $L_1$ is excited. The trough in the induction curve is caused by the screening circuit 3 shown in FIG. 2.

FIG. 3b shows the magnetic induction which is produced by the dynamic coil alone when it carries a given, constant current.

FIG. 3c shows the fields of the static and dynamic lenses superimposed. As can readily be seen, the two magnetic fields which are produced by the static and dynamic focussing coils add to one another linearly. The electron-optical power of refraction of this arrangement is dependant on the sum of the squares of the individual magnetic induction:

$$B^2 = (B1+B2)^2 = B_1^2 + 2B_1B_2 + B_2^2$$

In the case of the arrangement according to the invention the overall shift $\Delta Z$ in the position of the focus is no longer dependant solely on the change in $B_2^2$, and the product $2B_1B_2$ now plays a part also. This means that the existing field of lens $L_1$ multiplies the effect of the dynamic field of lens $L_2$.

In what follows a numeral example will be given based on a practical application. Let it be assumed that a magnetic lens forms a real, reduced image of an electron source lying 1,000 mm away at a distance of 100 mm from its centre. To achieve a given processing effect, the focus is to be altered by $\Delta Z = 5$ mm. This may for example be achieved by energising a static main lens to a value characteristic of magnetic induction of 160 relative units. To achieve the fast re-focussing mentioned, the relative change in induction which must take place in a dynamic focussing lens arranged outside tthe static lens as shown in FIG. 1 is one of 22 units. According to equation (1) the sum of the two squares is then:
$$B^2 \approx 3044 \approx 160^2 + 22^2$$

In the arrangement according to the invention as shown in FIG. 2, a substantially smaller change in the energisation of the dynamic lens is required. Let it again be assumed that the main lens is energised to a value characteristic of magnetic induction of 160 units. By virtue of the invention, a change in $B_2$ of only 1.5 units is now required for the fast adjustment of the focus. In the example this gives: $B^2 \approx 3044 \approx 160^2 + 2.160.15 + 1.5^2$ The relationship between the electrical powers required to activate the dynamic lens is:

$$\frac{N_{new}}{N_{old}} = \frac{B_{2\ new}^2}{B_{2\ old}^2} = \frac{1.5^2}{22^2} \approx \frac{1}{200}$$

The invention makes use of the "double product" as an additional influencing parameter which does not come into play when the main and auxiliary fields and spacially separated. As the numerical example shows, a substantially smaller operating power is requied to bring about the required shift in the focus.

With the dynamic and static focussing coils disposed in this way, it has been found that the fields have only a slight influence on one another and that there are therefore hardly any eddy-current and inductive losses. In particular it has been found that the quality of the lens is not affected, that is to say the aperture-dependant defect (spherical aberration) of the main lens is not increasesd, if the dynamic lens is arranged in this way. Previously it was thought that introducing a screening circuit of high magnetic permeability would have an adverse effect on the original field of the lens by increasing spherical aberration. However, investigations conducted with the arrangement according to the invention have shown that the aperture-dependant defect of the main lens is not increased.

A preferred application of the present invention is to materials processing and in particular to the production of screened gravure printing surfaces by electron beam engraving. In electron beam engraving it is necessary to adjust the position of the focus as a function of tonal value to obtain cells of varying area. The principles of arrangements for performing electron beam engraving have long been state of the art and are for example described in German Auslegeschrift No. 11 23 561.

The present invention is not however restricted to the field of electron beam engraving and can be used in the entire field of materials processing, or even in cathode ray tubes or electron microscopes, to allow the position of the focus to be altered quickly or re-adjusted, where this is necessary, while requiring only a small amount of space and a low level of operating power.

The control circuits required to operate the lenses are familiar state of the art and, like the general construction of an electron-beam machine, which is also also known, will not be described in detail.

The invention is not restricted to annular coils as focussing lenses and multipolar lenses may also be used. In the simplest case a combination of two quadrupolar lenses may be used which are arranged one behind the other to constitue the dynamic lens system.

I claim:

1. An electro-optical electromagnetic lens arrangement for controlling and altering the focus of an electron beam comprising an electromagnetic static focussing lens system, an electromagnetic dynamic focussing lens system situated within the static lens system, and a screen incorporated between the dynamic and static lens systems so that the flux generated by the static lens system does not traverse the dynamic lens system, and the flux generated by the dynamic lens system does not traverse the static lens system.

2. An electron-optical lens arrangement according to claim 1, wherein said dynamic focussing lens system is arranged substantially centrally of said static focussing lens system.

3. A lens arrangement according to claim 1, wherein said dynamic focussing lens system is arranged at the axial and radial centres of the static focussing lens system.

4. A lens system according to claim 1, wherein said dynamic lens system comprises an annular coil.

5. A lens arrangement according to claim 1, wherein said screen is composed of a high-frequency ferrite.

6. A lens arrangement according to claim 1, wherein said screen is composed of a highly permeable material.

7. A lens arrangement according to claim 6, wherein said screen is an annular body which surrounds said dynamic lens arrangement.

8. A lens arrangement according to claim 7, wherein said annular body is of U-shaped cross-section and carries the coil of said dynamic lens system in its interior.

9. A lens arrangement according to claim 6 wherein said screen is bonded to said dynamic coil system.

10. A lens arrangement according to claim 6, wherein said dynamic coil system is encapsulated within said screen which constitutes a mold therefor.

11. A lenses arrangement according to claim 6, wherein said screen is made from an electrically conductive high resistance casting material.

* * * * *